(12) United States Patent
Yamagata et al.

(10) Patent No.: US 11,622,482 B2
(45) Date of Patent: *Apr. 4, 2023

(54) ELECTROMAGNETIC WAVE ABSORBER AND ELECTROMAGNETIC WAVE ABSORBER-ATTACHED MOLDED ARTICLE

(71) Applicant: NITTO DENKO CORPORATION, Ibaraki (JP)

(72) Inventors: Kazuto Yamagata, Osaka (JP); Hironobu Machinaga, Osaka (JP); Yuuki Takeda, Osaka (JP); Hiroichi Ukei, Osaka (JP); Takehiro Ui, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 326 days.

This patent is subject to a terminal disclaimer.

(21) Appl. No.: 16/621,078

(22) PCT Filed: Mar. 27, 2018

(86) PCT No.: PCT/JP2018/012602
§ 371 (c)(1),
(2) Date: Dec. 10, 2019

(87) PCT Pub. No.: WO2018/230092
PCT Pub. Date: Dec. 20, 2018

(65) Prior Publication Data
US 2020/0214181 A1  Jul. 2, 2020

(30) Foreign Application Priority Data

Jun. 13, 2017 (JP) .............................. JP2017-116296

(51) Int. Cl.
*H05K 9/00* (2006.01)
*B32B 7/025* (2019.01)
(Continued)

(52) U.S. Cl.
CPC .......... *H05K 9/0088* (2013.01); *B32B 7/025* (2019.01); *B32B 7/06* (2013.01); *B32B 15/08* (2013.01);
(Continued)

(58) Field of Classification Search
CPC .......... H05K 9/00–9/0098; B32B 15/00–15/20
See application file for complete search history.

(56) References Cited

FOREIGN PATENT DOCUMENTS

| EP | 1720396 A1 | 11/2006 |
|---|---|---|
| JP | 5-114813 A | 5/1993 |

(Continued)

OTHER PUBLICATIONS

Machine translation of JPH08-307088. Retrieved Nov. 3, 2021.*
Machine translation JPH05-114813. Retrieved Nov. 3, 2021.*
Hudaya et al. "Characteristics of Fluorine-Doped Tin Oxide as a Transparent Heater on PET Prepared by ECR-MOCVD", ECS Transactions, 53(4), (2013); pp. 161-166.*
(Continued)

*Primary Examiner* — Prashant J Khatri
(74) *Attorney, Agent, or Firm* — WHDA, LLP

(57) ABSTRACT

An electromagnetic wave absorber (1) includes a dielectric layer (10), a resistive layer (20), and an electrically conductive layer (30). The resistive layer (20) is disposed on one principal surface of the dielectric layer (10). The electrically conductive layer (30) is disposed on the other principal surface of the dielectric layer (10) and has a sheet resistance lower than a sheet resistance of the resistive layer (20). The resistive layer (20) is a layer that includes tin oxide or titanium oxide as a main component or a layer that is made of indium tin oxide including 40 weight % or more of tin oxide.

13 Claims, 1 Drawing Sheet

(51) Int. Cl.
  *B32B 15/08* (2006.01)
  *B32B 7/06* (2019.01)
(52) U.S. Cl.
  CPC ..... *B32B 2255/20* (2013.01); *B32B 2307/212* (2013.01)

(56) References Cited

FOREIGN PATENT DOCUMENTS

| | | |
|---|---|---|
| JP | 8-307088 A | 11/1996 |
| JP | 10-13082 A | 1/1998 |
| JP | 2000-59066 A | 2/2000 |
| JP | 2000-215734 A | 8/2000 |
| JP | 2001-210144 A | 8/2001 |
| JP | 2002-76671 A | 3/2002 |
| JP | 2002-314284 A | 10/2002 |
| JP | 2003-198179 A | 7/2003 |
| JP | 2009-71278 A | 4/2009 |

OTHER PUBLICATIONS

Park et al. "Tin Oxide Films Made by Physical Vapor Deposition-Thermal Oxidation and Spray Pyrolysis", Chem. Mater. (1998), 10; pp. 2389-2398.*

Supriyono et al. "Preparation and characterization of transparent conductive SnO2—F thin film deposited by spray pyrolysis: relationship between loading level and some physical properties", Procedia Environmental Sciences 28 (2015 ); pp. 242-251.*

Elliott et al. "Electrochemical Properties of Polycrystalline Tin Oxide", J. Electrochem. Soc. 117, (1970); pp. 1343-1348.*

Office Action dated May 25, 2021, issued in counterpart JP Application No. 2017-116296, with English Translation. (12 pages).

International Search Report dated Jun. 26, 2018, issued in counterpart International Application No. PCT/JP2018/012602(2 pages).

Extended (Supplementary) European Search Report dated Feb. 24, 2021, issued in counterpart EP Application No. 18818526.8. (11 pages).

* cited by examiner

ELECTROMAGNETIC WAVE ABSORBER AND ELECTROMAGNETIC WAVE ABSORBER-ATTACHED MOLDED ARTICLE

TECHNICAL FIELD

The present invention relates to an electromagnetic wave absorber and an electromagnetic wave absorber-attached molded article.

BACKGROUND ART

In recent years, electromagnetic waves in a range of millimeter waves having a wavelength of about 1 to 10 mm and a frequency of 30 to 300 GHz and quasi-millimeter waves have been used as information communication media. The use of such electromagnetic waves in anti-collision systems has been under consideration. An anti-collision system is a system, for example, installed in a vehicle, detecting obstacles to automatically put on the brakes, or measuring the speed of vehicles around the vehicle equipped with the system and distance between the vehicle and another vehicle to adjust the speed of the vehicle and distance between the two vehicles. To allow anti-collision systems to normally operate, reception of as few unnecessary electromagnetic waves as possible is important for prevention of false recognition. Therefore, it is conceivable to use an electromagnetic wave absorber in anti-collision systems to absorb unnecessary electromagnetic waves.

There are various types of electromagnetic wave absorbers classified according to their principles of electromagnetic wave absorption. For example, an electromagnetic wave absorber provided with an electromagnetic wave reflective layer, a dielectric layer having a thickness of $\lambda/4$ ($\lambda$ is a wavelength of an electromagnetic wave to be absorbed), and a resistive film layer (such an electromagnetic wave absorber may be referred to as "$\lambda/4$ electromagnetic wave absorber") can be produced at a low cost owing to relatively inexpensive materials and ease of design. For example, Patent Literature 1 proposes, as a $\lambda/4$ electromagnetic wave absorber, an electromagnetic wave absorber exercising its function in a wide incident angular range.

CITATION LIST

Patent Literature

Patent Literature 1: JP 2003-198179 A

SUMMARY OF INVENTION

Technical Problem

Patent Literature 1 fails to specifically discuss the durability (for example, chemical resistance) typically required in environments where electromagnetic wave absorbers are used.

Therefore, the present invention provides an electromagnetic wave absorber including a resistive layer that is advantageous for exhibiting good chemical resistance. The present invention also provides an electromagnetic wave absorber-attached molded article including such an electromagnetic wave absorber.

Solution to Problem

The present invention provides an electromagnetic wave absorber, including:
a dielectric layer;
a resistive layer that is disposed on one principal surface of the dielectric layer; and
an electrically conductive layer that is disposed on the other principal surface of the dielectric layer and has a sheet resistance lower than a sheet resistance of the resistive layer, wherein
the resistive layer is a layer that includes tin oxide or titanium oxide as a main component or a layer that is made of indium tin oxide including 40 weight % or more of tin oxide.

The present invention also provides an electromagnetic wave absorber-attached molded article, including:
a molded article; and
the above electromagnetic wave absorber attached to the molded article.

Advantageous Effects of Invention

In the above electromagnetic wave absorber, the resistive layer has good chemical resistance.

DESCRIPTION OF EMBODIMENTS

Hereinafter, embodiments of the present invention will be described with reference to the drawings. The following description describes examples of the present invention, and the present invention is not limited to the following embodiments.

The present inventors have newly found the following problem in the course of considering application of electromagnetic wave absorbers to anti-collision systems. For example, when an electromagnetic wave absorber is used in an anti-collision system, the electromagnetic wave absorber is installed on a vehicle such as an automobile. A chemical such as a cleaner can be used sometimes for vehicle maintenance. For example, an alkaline cleaner can be used sometimes to wash vehicles. Thus, electromagnetic wave absorbers installed on vehicles can have contact with a chemical such as a cleaner while the vehicles are being washed. In particular, a resistive layer in a $\lambda/4$ electromagnetic wave absorber tends to be affected by such a chemical because the resistive layer is located near the surface of the electromagnetic wave absorber. This means that if a resistive layer of an electromagnetic wave absorber has good chemical resistance, a high-value added $\lambda/4$ electromagnetic wave absorber can be provided.

When a resistive layer for a $\lambda/4$ electromagnetic wave absorber has a sheet resistance closer to the characteristic impedance of air (about 377 $\Omega/\square$), good electromagnetic wave absorbing properties are more likely to be obtained. It is conceivable that, for example, a material such as indium tin oxide (ITO) is used as a resistive layer. ITO is also used in technical fields of for example, flat panel displays and solar cells. In these technical fields, ITO serves as a transparent electrode, and thus an ITO having a low specific resistance (for example, $4\times10^{-4}$ Ω·cm or less) is preferably used in these technical fields. Therefore, when a resistive layer of a λ/4 electromagnetic wave absorber is formed using the ITO preferably used in these technical fields, the thickness of the resistive layer needs to be reduced to impart the desired sheet resistance to the resistive layer. However, reduction in thickness of a resistive layer makes it difficult to achieve good chemical resistance. Therefore, through a lot of trial and error, the present inventors have identified a resistive layer material capable of imparting the desired sheet resistance at a thickness equal to or greater than a given thickness and advantageous for achieving good chemical resistance. Based on this new finding, the present inventors have invented an electromagnetic wave absorber according to the present invention.

Figure 1:
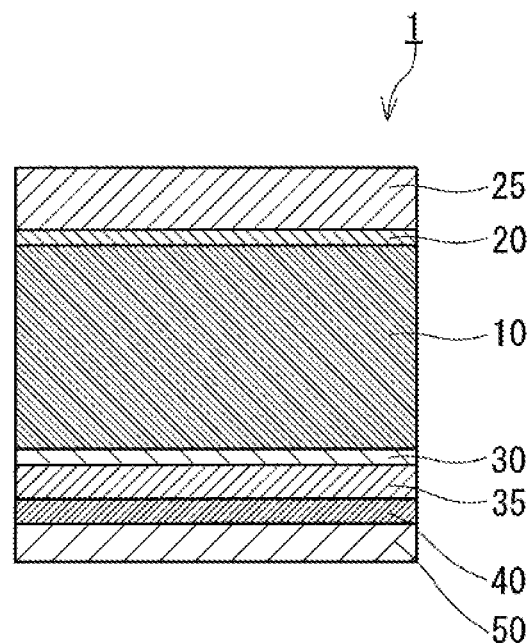
FIG. 1 is a cross-sectional view showing an example of an electromagnetic wave absorber of the present invention.

As shown in FIG. 1, an electromagnetic wave absorber 1 includes a dielectric layer 10, a resistive layer 20, and an electrically conductive layer 30. The resistive layer 20 is disposed on one principal surface of the dielectric layer 10. The electrically conductive layer 30 is disposed on the other principal surface of the dielectric layer 10 and has a sheet resistance lower than a sheet resistance of the resistive layer 20. The resistive layer 20 is a layer that includes tin oxide or titanium oxide as a main component or a layer that is made of indium tin oxide including 40 weight % or more of tin oxide. The term "main component" as used herein refers to a component whose content is highest on a weight basis. When the resistive layer 20 includes tin oxide or titanium oxide as its main component, typically, the content of tin oxide or titanium oxide in the resistive layer 20 is 50 weight % or more. When the resistive layer 20 is a layer made of any of the above materials, the resistive layer 20 has good chemical resistance; accordingly, the electromagnetic wave absorber 1 has good chemical resistance.

The electromagnetic wave absorber 1 is a λ/4 electromagnetic wave absorber. The λ/4 electromagnetic wave absorber is designed so that incidence of an electromagnetic wave having a wavelength ($\lambda_O$) to be absorbed will result in interference between the electromagnetic wave reflected by the surface of the resistive layer 20 (front surface reflection) and the electromagnetic wave reflected by the electrically conductive layer 30 (back surface reflection). In the λ/4 electromagnetic wave absorber, the wavelength (ho) of an electromagnetic wave to be absorbed is determined according to the thickness (t) of the dielectric layer 10 and the relative permittivity ($\varepsilon_r$) of the dielectric layer 10, as shown in the following equation (1). That is, an electromagnetic wave having a wavelength to be absorbed can be set by appropriately adjusting the material and thickness of the dielectric layer 10. In the equation (1), sqrt($\varepsilon_r$) means a square root of the relative permittivity ($\varepsilon_r$).

$$\lambda_O = 4t \times \text{sqrt}(\varepsilon_r) \quad \text{Equation (1)}$$

The resistive layer 20 has a specific resistance of, for example, $5\times10^{-4}$ Ω·cm or more. In this case, in order to impart the desired sheet resistance to the resistive layer 20, the resistive layer 20 needs to be formed to have a thickness of a given value (for example, 15 nm) or more. The resistive layer 20 thus has good chemical resistance.

The resistive layer 20 has a specific resistance of, for example, $100\times10^{-4}$ Ω·cm or less. In this case, the resistive layer thickness required to impart the desired sheet resistance to the resistive layer 20 can be adjusted to a given value (for example, 500 nm) or less, and the time required to form the resistive layer 20 can be shortened. The specific resistance of the resistive layer 20 is desirably $50\times10^{-4}$ Ω·cm or less and more desirably $30\times10^{-4}$ Ω·cm or less.

When the resistive layer 20 is a layer including tin oxide or titanium oxide as its main component, the resistive layer 20 may be a layer including tin oxide or titanium oxide only. The resistive layer 20 desirably further includes a dopant that is at least one element other than tin and titanium. This makes it easy to adjust the specific resistance of the resistive layer 20 to fall within the desired range. For example, when the resistive layer 20 is a layer including tin oxide only, the specific resistance of the resistive layer 20 is relatively large and thus the resistive layer 20 needs to be made relatively thick to achieve the desired sheet resistance. However, when the resistive layer 20 includes tin oxide as its main component and further includes the predetermined dopant, the specific resistance of the resistive layer 20 can be reduced to fall within a more desired range (for example, 5 to $50\times10^{-4}$ Ω·cm) and the resistive layer 20 can be reduced in thickness more than the resistive layer 20 including tin oxide only.

The resistive layer 20 is made of, for example, antimony-doped tin oxide, fluorine-doped tin oxide, or niobium-doped titanium oxide. In this case, the specific resistance of the resistive layer 20 can be more reliably adjusted to fall within the desired range (for example, 5 to $50\times10^{-4}$ Ω·cm).

When the resistive layer 20 is made of antimony-doped tin oxide, the content of antimony in the resistive layer 20 is, for example, 1 to 8 atomic % and desirably 2 to 5 atomic %. When the resistive layer 20 is made of fluorine-doped tin oxide, the content of fluorine in the resistive layer 20 is, for example, 1 to 10 atomic % and desirably 3 to 8 atomic %. When the resistive layer 20 is made of niobium-doped titanium oxide, the content of niobium in the resistive layer 20 is, for example, 2 to 12 atomic % and desirably 4 to 10 atomic %.

The resistive layer 20 has a sheet resistance of, for example, 200 to 600 Ω/□. Thus, the resistive layer 20 has a sheet resistance close to the characteristic impedance of air and the electromagnetic wave absorber 1 can exhibit good electromagnetic wave absorption performance. For example, selective absorption of an electromagnetic wave having a wavelength generally employed by a millimeter-wave radar or quasi-millimeter-wave radar is made easy. For example, the electromagnetic wave absorber 1 can effectively attenuate an electromagnetic wave having a frequency of 50 to 100 GHz, particularly 60 to 90 GHz, employed by a millimeter-wave radar.

The resistive layer 20 desirably has a sheet resistance of 260 to 500 Ω/□. This allows the electromagnetic wave absorber 1 to more reliably exhibit good electromagnetic wave absorption performance.

The resistive layer 20 has a thickness of, for example, 15 to 500 nm. This allows the resistive layer 20 to have good chemical resistance and can shorten the time required to form the resistive layer 20. The resistive layer 20 desirably has a thickness of 15 to 200 nm.

The resistive layer 20 can be formed by sputtering such as DC magnetron sputtering, physical vapor deposition such as vacuum deposition, ion plating, or pulsed laser deposition, chemical vapor deposition such as thermal CVD, or spray pyrolysis deposition, for example, depending on the material of the resistive layer 20.

As shown in FIG. 1, the resistive layer 20 is, for example, laminated on the polymer film 25 at an opposite surface to a surface at which the resistive layer 20 is in contact with the dielectric layer 10. The polymer film 25 functions as a support of the resistive layer 20. In the case where the resistive layer 20 is produced, for example, by any of the above film formation methods, the polymer film 25 desirably has heat resistance high enough to resist heat applied in the film formation or a subsequent annealing treatment and is desirably made of a material providing a smooth surface. Moreover, since the polymer film 25 is disposed to cover the resistive layer 20, the polymer film 25 having high chemical resistance imparts high chemical resistance to the electromagnetic wave absorber 1. Therefore, examples of the material of the polymer film 25 include: polyester resins such as polyethylene terephthalate (PET) and polyethylene naphthalate (PEN); acrylic resins such as polymethyl methacrylate (PMMA); polycarbonate (PC); cycloolefin polymer (COP);

aromatic polyetherketones such as polyetheretherketone (PEEK); aromatic polyamides (aramids); and polyimides. The material of the support of the resistive layer 20 is desirably PET in terms of the balance among good chemical resistance, the dimensional stability, and cost.

The polymer film 25 has a thickness of, for example, 10 to 150 μm, desirably 20 to 100 μm, and more desirably 30 to 80 μm. This can decrease the flexural rigidity of the polymer film 25, and can reduce occurrence of a crease or deformation in the case where the resistive layer 20 is formed on the polymer film 25.

The dielectric layer 10 has a relative permittivity of, for example, 1 to 10. This allows the electromagnetic wave absorber 1 to exhibit good electromagnetic wave absorption performance in a wide bandwidth (for example, a bandwidth of 2 GHz or more in the frequency band from 50 to 100 GHz). The relative permittivity of the dielectric layer 10 can be measured, for example, by cavity resonator perturbation.

The dielectric layer 10 may be a single layer, or may be a laminate consisting of a plurality of layers. When the dielectric layer 10 is a laminate consisting of a plurality of layers, the relative permittivity of the dielectric layer 10 can be determined by measuring the respective layers for the relative permittivity, multiplying the obtained relative permittivity values of the respective layers by the proportions of the thicknesses of the respective layers to the thickness of the whole dielectric layer 10, and adding the resultant values.

The material of the dielectric layer 10 is not limited to a particular one, but the dielectric layer 10 is made of, for example, a polymeric material. Examples of the polymeric material of the dielectric layer 10 include synthetic resins (including thermoplastic elastomers) such as acrylic resin, ethylene-vinyl acetate copolymer (EVA), polyvinyl chloride, polyurethane, acrylic urethane resin, polyolefin, polypropylene, polyethylene, silicone resin, polyethylene terephthalate, polyester, polystyrene, polyimide, polycarbonate, polyamide, polysulfone, polyethersulfone, and epoxy resin and synthetic rubbers such as polyisoprene rubber, polystyrene-butadiene rubber, polybutadiene rubber, chloroprene rubber, acrylonitrile-butadiene rubber, butyl rubber, acrylic rubber, ethylene propylene rubber, and silicone rubber. One of these is used alone as the polymeric material of the dielectric layer 10, or a combination of two or more thereof is used as the polymeric material of the dielectric layer 10.

The dielectric layer 10 may be a foam in some cases. This makes it likely that the dielectric layer 10 has a low relative permittivity. Moreover, this can make the dielectric layer 10 lighter. Examples of the foam include olefin foams and polyester foams.

The thickness of the dielectric layer 10 is, for example, 50 to 2000 μm and desirably 100 to 1000 μm. This makes it easy to achieve both high dimensional accuracy and low cost.

In the vicinity of the rear surface of the electromagnetic wave absorber, the electrically conductive layer 30 reflects an electromagnetic wave to be absorbed by the electromagnetic wave absorber 1. The electrically conductive layer 30 has a sheet resistance of, for example, 0.001 to 30 Ω/□. This makes it easy for the electromagnetic wave absorber 1 to exhibit the desired electromagnetic wave absorption performance. For example, the electromagnetic wave absorber 1 can effectively attenuate an electromagnetic wave having a frequency of 50 to 100 GHz, particularly 60 to 90 GHz, employed by a millimeter-wave radar.

The electrically conductive layer 30 includes, for example, at least one of aluminum, an aluminum alloy, aluminum nitride, copper, a copper alloy, copper nitride, and indium tin oxide. This makes it easy for the electromagnetic wave absorber 1 to exhibit the desired electromagnetic wave absorption performance. When the electrically conductive layer 30 includes ITO, the electrically conductive layer 30 is preferably an ITO containing 5 to 15 weight % of tin oxide.

As shown in FIG. 1, the electrically conductive layer 30 may be laminated on the polymer film 35. The polymer film 35 functions as a support supporting the electrically conductive layer 30. In this case, the material of the polymer film 35 may be any one of those mentioned as examples of the material of the polymer film 25, or may be polyester, polypropylene, polyurethane, urethane acrylic resin, biaxially-oriented polypropylene (BOPP), or vinylidene chloride resin. The polymer film 35 can be omitted in some cases.

A certain coating may be provided on a principal surface which is of either the resistive layer 20 or electrically conductive layer 30 and which faces the dielectric layer 10. This can prevent the component included in the dielectric layer 10 from spreading to the resistive layer 20 or electrically conductive layer 30 and affecting the properties of the resistive layer 20 or electrically conductive layer 30. Examples of the material of such a coating include silicon oxide such as $SiO_2$, silicon nitride, aluminum oxide such as $Al_2O_3$, aluminum nitride (AlN), niobium oxide such as $Nb_2O_5$ strontium titanate (STO), and aluminum zinc oxide (AZO). In particular, when the material of the coating is AlN or AZO, the durability of the resistive layer 20 or electrically conductive layer 30 can be advantageously enhanced.

As shown in FIG. 1, the electromagnetic wave absorber 1 further includes, for example, an adhesive layer 40 and a separator 50. The adhesive layer 40 is disposed on an external side of the electrically conductive layer 30. The separator 50 is disposed in contact with the adhesive layer 40. The electromagnetic wave absorber 1 can be easily attached to an article such as a molded article by peeling off the separator 50 to bare the adhesive layer 40 and pressing the adhesive layer 40 against the article. The adhesive layer 40 can be protected by the separator 50 until the electromagnetic wave absorber 1 is attached to an article.

The adhesive layer 40 includes, for example, a pressure sensitive adhesive such as an acrylic adhesive, a rubber adhesive, a silicone adhesive, or an urethane adhesive.

Figure 2:
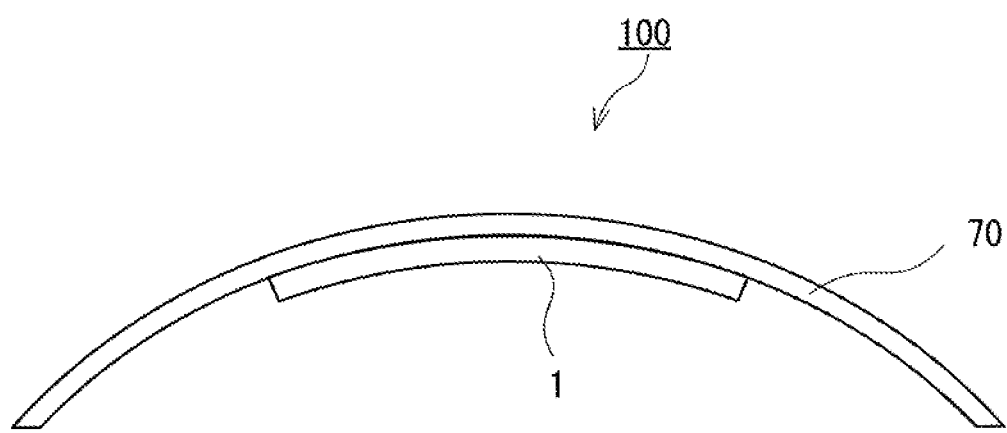
FIG. 2 is a side view showing an example of an electromagnetic wave absorber-attached molded article of the present invention.

As shown in FIG. 2, an electromagnetic wave absorber-attached molded article 100, for example, can be produced using the electromagnetic wave absorber 1. The electromagnetic wave absorber-attached molded article 100 includes a molded article 70 and the electromagnetic wave absorber 1 attached to the molded article 70. Examples of the molded article 70 include automotive parts such as a bumper.

An example of a method for producing the electromagnetic wave absorber 1 will be described. The resistive layer 20 is formed on the polymer film 25 by a film formation method such as sputtering. In addition, a laminate in which the electrically conductive layer 30 is formed on the polymer film 35 is prepared.

Next, a resin composition molded to have a predetermined thickness and forming the dielectric layer 10 is put on one principal surface of the electrically conductive layer 30. After that, one principal surface of the resistive layer 20 is placed on the resin composition forming the dielectric layer 10. The resin composition is cured if necessary. The electromagnetic wave absorber 1 can be produced in this manner. According to this method, the thickness of the dielectric layer 10 is controlled easily, and thus the electromagnetic wave absorber 1 can be produced so that the electromagnetic wave absorber 1 can effectively absorb an electromagnetic wave having a wavelength to be absorbed. Moreover, since the resistive layer 20 and electrically conductive layer 30 are formed separately, the time required to produce the electromagnetic wave absorber 1 is short and the production cost of the electromagnetic wave absorber 1 is low. An adhesive or a pressure sensitive adhesive may be used to adhere the dielectric layer 10 and electrically conductive layer 30 or resistive layer 20.

EXAMPLES

Hereinafter, the present invention will be described in more detail by examples. The present invention is not limited to the examples given below. First, methods for measuring the properties of resistive layers according to Examples and Comparative Examples and a method for evaluating samples according to Examples and Comparative Examples will be described.

[X-Ray Diffraction]

In Examples and Comparative Examples, the thickness was measured for the resistive layers by X-ray reflectivity using an X-ray diffractometer (manufactured by Rigaku Corporation, product name: RINT2200). X-ray diffraction patterns of the resistive layers were also obtained using the X-ray diffractometer. CuKα radiation was used as the X-ray. Whether the resistive layers have a polycrystalline structure or an amorphous structure was confirmed from the obtained X-ray diffraction patterns. The results are shown in Table 1.

[Sheet Resistance]

The sheet resistance of the resistive layers according to Examples and Comparative Examples not having undergone a chemical immersion treatment was measured by an eddy current method according to Japanese Industrial Standards (JIS) Z 2316 using a non-contact resistance measurement apparatus (manufactured by NAPSON CORPORATION, product name: NC-80MAP). The results are shown in Table 1. Additionally, the resistive layers having undergone a chemical immersion treatment were also measured for the sheet resistance.

[Specific Resistance]

In each of Examples and Comparative Examples, the specific resistance of the resistive layer was determined by calculating a product of the thickness measured as above for the resistive layer and the sheet resistance measured as above for the resistive layer not having undergone a chemical immersion treatment. The results are shown in Table 1.

[Relative Permittivity]

The relative permittivity of the dielectric layers according to Examples and Comparative Examples at 10 GHz was measured by cavity resonator perturbation using a network analyzer (manufactured by Agilent Technologies, Inc., product name: N5230C) and cavity resonator (Cavity Resonator CP-531, manufactured by Kanto Electronics Application Development Inc.).

[Electromagnetic Wave Absorption Properties]

The return loss (absolute value of the amount of reflection) was measured according to JIS R 1679:2007 using a 76-GHz millimeter wave perpendicularly incident on a surface of each of a sample A (not having undergone a chemical immersion treatment) and sample B (having undergone a chemical immersion treatment) according to each of Examples and Comparative Examples. The results are shown in Table 1. Moreover, comprehensive evaluation was performed for Examples and Comparative Examples according to the following measures. The results are shown in Table 1.

a: Both the sample A and sample B have a return loss of 20 dB or more.

b: Either the sample A or sample B or both the sample A and sample B have a return loss of 10 dB or more and less than 20 dB.

x: Either the sample A or sample B or both the sample A and sample B have a return loss of less than 10 dB.

Example 1

A film made of $SnO_2$ was formed on a 50-μm-thick polyimide film (Upilex manufactured by Ube Industries, Ltd.) by an RF magnetron sputtering method (substrate temperature: room temperature) using $SnO_2$ as a target material. This film was crystallized by a heat treatment (annealing treatment) at 300° C. for 1 hour. A resistive layer according to Example 1 made of $SnO_2$ was formed in this manner. The thickness, sheet resistance, and specific resistance of the resistive layer according to Example 1 are shown in Table 1. A dielectric layer according to Example 1 was produced by press-molding an acrylic resin having a relative permittivity of 2.5 to have a thickness of 560 μm. As an electrically conductive layer according to Example 1, an aluminum foil having a sheet resistance of 0.002 Ω/□ was prepared. The resistive layer according to Example 1 not having undergone a chemical immersion treatment was adhered to one principal surface of the dielectric layer according to Example 1 so that the resistive layer according to Example 1 was in contact with the principal surface. Additionally, the electrically conductive layer according to Example 1 was brought into contact with and adhered to the other principal surface of the dielectric layer according to Example 1. A sample A according to Example 1 was produced in this manner.

A resistive layer as formed above in Example 1 was formed on a polyimide film as used above. A chemical immersion treatment was performed in which the polyimide film having the resistive layer formed thereon was immersed in a 5 weight % aqueous solution of NaOH for 5 minutes, followed by air drying to produce a resistive layer having undergone the chemical immersion treatment. The temperature of the aqueous NaOH solution used in the chemical immersion treatment was 40° C. A sample B according to Example 1 was produced in the same manner as for the sample A, except that the resistive layer having undergone the chemical immersion treatment was used instead of the resistive layer according to Example 1 not having undergone the chemical immersion treatment.

Example 2

A resistive layer according to Example 2 made of fluorine-doped tin oxide (fluorine content: 5 atomic %) was formed on a 50-μm-thick polyimide film (Upilex manufactured by Ube Industries, Ltd.) by an RF magnetron sputtering method (substrate temperature: 200° C.) using a mixture of $SnF_2$ powder and $SnO_2$ powder as a target material. A sample A (not having undergone the chemical immersion treatment) and sample B (having undergone the chemical immersion treatment) according to Example 2 were produced in the same manner as in Example 1, except that the resistive layer according to Example 2 was used instead of the resistive layer according to Example 1.

Example 3

A resistive layer according to Example 3 made of antimony-doped tin oxide (antimony content: 4 atomic %) was formed on a 50-μm-thick polyimide film (Upilex manufactured by Ube Industries, Ltd.) by a reactive MF-AC magnetron sputtering method (frequency of power source: 200 kHz; substrate temperature: 200° C.) using a Sn—Sb alloy as a target material and oxygen gas as a reactive gas. A sample A (not having undergone the chemical immersion treatment) and sample B (having undergone the chemical immersion treatment) according to Example 3 were produced in the same manner as in Example 1, except that the resistive layer according to Example 3 was used instead of the resistive layer according to Example 1.

Example 4

A film made of niobium-doped titanium oxide (niobium content: 8 atomic %) was formed on a 50-μm-thick polyimide film (Upilex manufactured by Ube Industries, Ltd.) by an RF magnetron sputtering method (substrate temperature: room temperature) using Nb-containing $TiO_2$ as a target material. This film was crystallized by a heat treatment (annealing treatment) at 350° C. for 1 hour. A resistive layer according to Example 4 was formed in this manner. A sample A (not having undergone the chemical immersion treatment) and sample B (having undergone the chemical immersion treatment) according to Example 4 were produced in the same manner as in Example 1, except that the resistive layer according to Example 4 was used instead of the resistive layer according to Example 1.

Example 5

A resistive layer according to Example 5 made of an amorphous ITO including 50 weight % of $SnO_2$ was formed on a 38-μm-thick PET film (DIAFOIL manufactured by Mitsubishi Chemical Corporation) by a DC magnetron sputtering method (substrate temperature: 130° C.) using ITO as a target material. A sample A (not having undergone the chemical immersion treatment) and sample B (having undergone the chemical immersion treatment) according to Example 5 were produced in the same manner as in Example 1, except that the resistive layer according to Example 5 was used instead of the resistive layer according to Example 1.

Example 6

A resistive layer according to Example 6 made of an amorphous ITO including 45 weight % of $SnO_2$ was formed on a 38-μm-thick PET film (DIAFOIL manufactured by Mitsubishi Chemical Corporation) by a DC magnetron sputtering method (substrate temperature: 130° C.) using ITO as a target material. A sample A (not having undergone the chemical immersion treatment) and sample B (having undergone the chemical immersion treatment) according to Example 6 were produced in the same manner as in Example 1, except that the resistive layer according to Example 6 was used instead of the resistive layer according to Example 1.

Comparative Example 1

A film made of an amorphous ITO including 10 weight % of $SnO_2$ was formed on a 38-μm-thick PET film (DIAFOIL manufactured by Mitsubishi Chemical Corporation) by a DC magnetron sputtering method (substrate temperature: 130° C.) using ITO as a target material. This film was crystallized by a heat treatment (annealing treatment) at 150° C. for 6 hours. A resistive layer according to Comparative Example 1 made of an ITO having a polycrystalline structure was formed in this manner. A sample A (not having undergone the chemical immersion treatment) and sample B (having undergone the chemical immersion treatment) according to Comparative Example 1 were produced in the same manner as in Example 1, except that the resistive layer according to Comparative Example 1 was used instead of the resistive layer according to Example 1.

Comparative Example 2

A resistive layer according to Comparative Example 2 made of an amorphous ITO including 10 weight % of $SnO_2$ was formed on a 38-μm-thick PET film (DIAFOIL manufactured by Mitsubishi Chemical Corporation) by a DC magnetron sputtering method (substrate temperature: 130° C.) using ITO as a target material. A sample A (not having undergone the chemical immersion treatment) and sample B (having undergone the chemical immersion treatment) according to Comparative Example 2 were produced in the same manner as in Example 1, except that the resistive layer according to Comparative Example 2 was used instead of the resistive layer according to Example 1.

Comparative Example 3

A resistive layer according to Comparative Example 3 made of an amorphous ITO including 20 weight % of $SnO_2$ was formed on a 38-μm-thick PET film (DIAFOIL manufactured by Mitsubishi Chemical Corporation) by a DC magnetron sputtering method (substrate temperature: 130° C.) using ITO as a target material. A sample A (not having undergone the chemical immersion treatment) and sample B (having undergone the chemical immersion treatment) according to Comparative Example 3 were produced in the same manner as in Example 1, except that the resistive layer according to Comparative Example 3 was used instead of the resistive layer according to Example 1.

Comparative Example 4

A resistive layer according to Comparative Example 4 made of an amorphous IZO including 10 weight % of ZnO was formed on a 38-μm-thick PET film (DIAFOIL manufactured by Mitsubishi Chemical Corporation) by a DC magnetron sputtering method (substrate temperature: 130° C.) using indium zinc oxide (IZO) as a target material. A sample A (not having undergone the chemical immersion treatment) and sample B (having undergone the chemical immersion treatment) according to Comparative Example 4 were produced in the same manner as in Example 1, except that the resistive layer according to Comparative Example 4 was used instead of the resistive layer according to Example 1.

Comparative Example 5

A resistive layer according to Comparative Example 5 made of a polycrystalline material (GZO) including ZnO as a main component and 3 weight % of $Ga_2O_3$ was formed on 38-μm-thick PET film (DIAFOIL manufactured by Mitsubishi Chemical Corporation) by a DC magnetron sputtering method (substrate temperature: 130° C.) using a ZnO including a small amount of $Ga_2O_3$ as a target material. A sample A (not having undergone the chemical immersion treatment) and sample B (having undergone the chemical immersion treatment) according to Comparative Example 5 were produced in the same manner as in Example 1, except that the resistive layer according to Comparative Example 5 was used instead of the resistive layer according to Example 1.

Comparative Example 6

A resistive layer according to Comparative Example 6 made of a polycrystalline material (AZO) including ZnO as a main component and 3 weight % of $Al_2O_3$ was formed on a 38-μm-thick PET film (DIAFOIL manufactured by Mitsubishi Chemical Corporation) by a DC magnetron sputtering method (substrate temperature: 130° C.) using a ZnO including a small amount of $Al_2O_3$ as a target material. A sample A (not having undergone the chemical immersion treatment) and sample B (having undergone the chemical immersion treatment) according to Comparative Example 6 were produced in the same manner as in Comparative Example 5, except that the resistive layer according to Comparative Example 6 was used instead of the resistive layer according to Comparative Example 5.

As shown in Table 1, it is indicated that good chemical resistance is achieved when the resistive layer is a layer including tin oxide or titanium oxide as a main component or a layer made of tin-doped indium oxide including 40 weight % or more of tin oxide.

TABLE 1

| | Resistive layer | | | | | Electrically conductive layer | | Return loss | | |
| | | | | | | | | Sample A not having undergone | Sample B having undergone | |
| | Material | Structure | Thickness [nm] | Initial sheet resistance [Ω/□] | Initial specific resistance [×$10^{-4}$ Ω·cm] | Sheet resistance after chemical immersion treatment [Ω/□] | Material | Initial sheet resistance [Ω/□] | chemical immersion treatment [dB] | chemical immersion treatment [dB] | Comprehensive evaluation |
|---|---|---|---|---|---|---|---|---|---|---|---|
| Example 1 | $SnO_2$ | Polycrystalline | 205 | 440 | 90 | 438 | Al | 0.002 | 21 | 21 | a |
| Example 2 | F-doped $SnO_2$ | Polycrystalline | 97 | 390 | 38 | 393 | Al | 0.002 | 28 | 27 | a |
| Example 3 | Sb-doped $SnO_2$ | Polycrystalline | 49 | 405 | 20 | 401 | Al | 0.002 | 24 | 25 | a |
| Example 4 | Nb-doped $TiO_2$ | Polycrystalline | 19 | 372 | 7.0 | 382 | Al | 0.002 | 31 | 30 | a |
| Example 5 | ITO ($SnO_2$ content: 50 weight %) | Amorphous | 101 | 345 | 35 | 354 | Al | 0.002 | 26 | 27 | a |
| Example 6 | ITO ($SnO_2$ content: 45 weight %) | Amorphous | 49 | 411 | 20 | 420 | Al | 0.002 | 24 | 23 | a |
| Comparative Example 1 | ITO ($SnO_2$ content: 10 weight %) | Polycrystalline | 10 | 395 | 4.0 | 782 | Al | 0.002 | 25 | 8 | x |
| Comparative Example 2 | ITO ($SnO_2$ content: 10 weight %) | Amorphous | 27 | 354 | 9.6 | 980 | Al | 0.002 | 28 | 2 | x |
| Comparative Example 3 | ITO ($SnO_2$ content: 20 weight %) | Amorphous | 35 | 400 | 1.4 | 560 | Al | 0.002 | 25 | 13 | b |
| Comparative Example 4 | IZO (ZnO content: 10 weight %) | Amorphous | 18 | 340 | 6.1 | 3530 | Al | 0.002 | 25 | 0 | x |
| Comparative Example 5 | GZO ($Ga_2O_3$ content: 3 weight %) | Polycrystalline | 72 | 415 | 30 | 2360 | Al | 0.002 | 23 | 1 | x |
| Comparative Example 6 | AZO ($Al_2O_3$ content: 3 weight %) | Polycrystalline | 145 | 398 | 58 | 1826 | Al | 0.002 | 25 | 1 | x |

The invention claimed is:

1. An electromagnetic wave absorber, comprising:
a dielectric layer;
a resistive layer that is disposed on one principal surface of the dielectric layer; and
an electrically conductive layer that is disposed on the other principal surface of the dielectric layer and has a sheet resistance lower than a sheet resistance of the resistive layer, wherein
the resistive layer is a layer that comprises tin oxide or titanium oxide as a main component or a layer that is made of indium tin oxide comprising 40 weight % or more of tin oxide, and
the resistive layer has a polycrystalline structure when the resistive layer comprises tin oxide or titanium oxide as a main component.

2. The electromagnetic wave absorber according to claim 1, wherein the resistive layer has a specific resistance of $5 \times 10^{-4}$ Ω·cm or more.

3. The electromagnetic wave absorber according to claim 1, wherein the resistive layer further comprises a dopant that is at least one element other than tin and titanium.

4. The electromagnetic wave absorber according to claim 1, wherein the resistive layer is made of antimony-doped tin oxide, fluorine-doped tin oxide, or niobium-doped titanium oxide.

5. The electromagnetic wave absorber according to claim 1, wherein the resistive layer has a sheet resistance of 200 to 600 Ω/□.

6. The electromagnetic wave absorber according to claim 1, wherein the resistive layer has a thickness of 5 to 500 nm.

7. The electromagnetic wave absorber according to claim 1, wherein the resistive layer is laminated on a polymer film at an opposite surface to a surface at which the resistive layer is in contact with the dielectric layer.

8. The electromagnetic wave absorber according to claim 1, wherein the dielectric layer has a relative permittivity of 1 to 10.

9. The electromagnetic wave absorber according to claim 1, wherein the dielectric layer is made of a polymeric material.

10. The electromagnetic wave absorber according to claim 1, wherein the electrically conductive layer has a sheet resistance of 0.001 to 30 Ω/□.

11. The electromagnetic wave absorber according to claim 1, wherein the electrically conductive layer comprises at least one of aluminum, an aluminum alloy, aluminum nitride, copper, a copper alloy, copper nitride, and indium tin oxide.

12. An electromagnetic wave absorber-attached molded article, comprising:
a molded article; and
the electromagnetic wave absorber according to claim 1 attached to the molded article.

13. The electromagnetic wave absorber according to claim 1, wherein the electromagnetic wave absorber has a return loss of 20 dB or more for an electromagnetic wave to be absorbed when the resistive layer is immersed in a 5 weight % aqueous solution of NaOH for 5 minutes, and
the electromagnetic wave absorber has a return loss of 20 dB or more for the electromagnetic wave to be absorbed when the resistive layer refrains from being immersed in a 5 weight % aqueous solution of NaOH for 5 minutes.

\* \* \* \* \*